(12) United States Patent
Stern

(10) Patent No.: US 6,242,959 B1
(45) Date of Patent: Jun. 5, 2001

(54) PROGRAMMABLE DELAY CIRCUIT AND METHOD WITH DUMMY CIRCUIT COMPENSATION

(75) Inventor: Kenneth J. Stern, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/453,148

(22) Filed: Dec. 2, 1999

(51) Int. Cl.[7] .................................................. H03H 11/26
(52) U.S. Cl. ................................................ 327/262; 327/270
(58) Field of Search ..................................... 327/262, 270, 327/274, 276, 280, 287, 156, 158, 161

(56) References Cited

U.S. PATENT DOCUMENTS

| | | | |
|---|---|---|---|
| 4,922,141 * | 5/1990 | Lofgren et al. | 327/158 |
| 5,124,593 | 6/1992 | Michel | 327/554 |
| 5,428,309 * | 6/1995 | Yamauchi et al. | 327/158 |
| 5,598,039 | 1/1997 | Weber | 307/38 |
| 5,719,514 * | 2/1998 | Sato | 327/262 |

* cited by examiner

Primary Examiner—Tuan T. Lam
Assistant Examiner—Linh Nguyen
(74) Attorney, Agent, or Firm—Koppel & Jacobs

(57) ABSTRACT

One or more main programmed delay circuits (PDCs) are compensated to provide constant delays despite variations in environmental factors, such as temperature and power supply, by means of a dummy PDC that emulates the main PDCs in environmental sensitivity. While the main PDCs have dynamically changing programmed inputs, the dummy PDC has a constant programmed input. Changes in the dummy PDC's delay due to environmental changes are monitored and a correction signal is applied to the dummy PDC to maintain its delay substantially constant, with the same correction provided to the main PDCs to correct for the same changes in the delay of these circuits. The dummy PDC is preferably initially calibrated so that its fixed delay period coincides with an integer number of clock periods. Both the main and dummy PDCs preferably produce respective delays equal to the linear sum of a programmed delay and their correction delays.

36 Claims, 2 Drawing Sheets

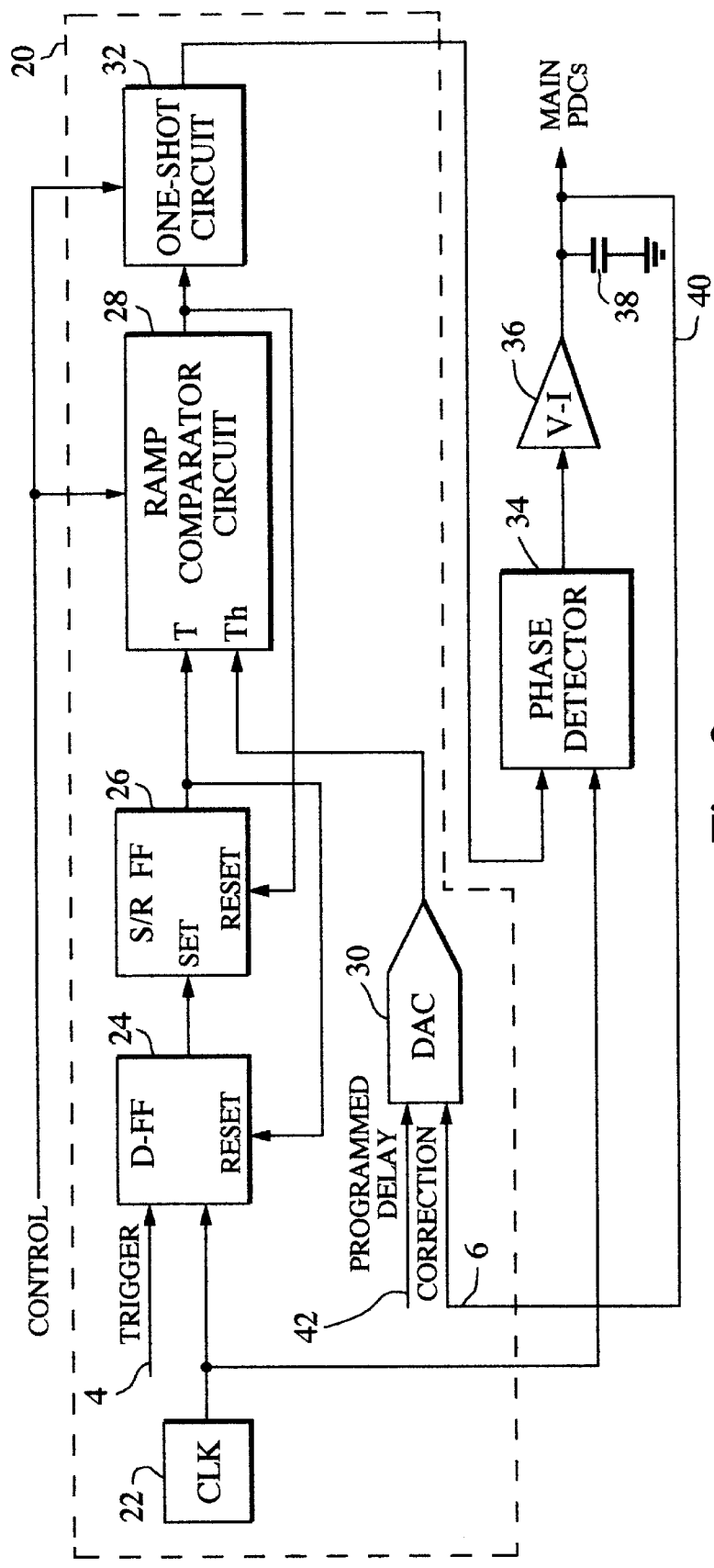
Fig. 2
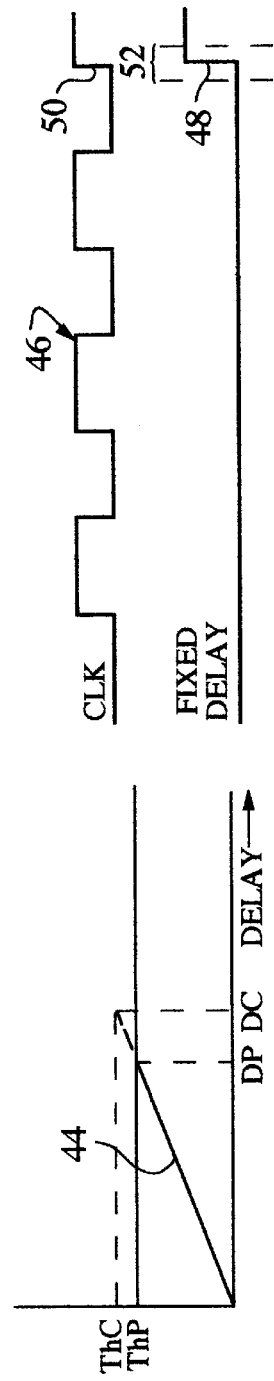
Fig. 3
Fig. 4

PROGRAMMABLE DELAY CIRCUIT AND METHOD WITH DUMMY CIRCUIT COMPENSATION

BACKGROUND OF THE INVENTION

1. Field of the Invention

This invention relates to programmable delay circuits and operating methods with correction for delay time errors resulting from variations in environmental factors such as temperature and power supply voltage.

2. Description of the Related Art

Programmable delay circuits (PDCs) are commonly employed in applications such as timing interpolators, which require delays that can be adjusted under user control. However, because of signal conditioning required to place the timing reference signal in an appropriate state for the variable delay element, and also to condition the timing reference signal to properly drive outside circuitry, an offset time is introduced into the delay circuit. This offset time varies significantly with changes in environmental factors such as temperature and power supply voltage, and thus adds an error term to the desired delay period. This problem is particularly serious for electronic test equipment, which requires a very low temperature sensitivity.

The general approach to reducing delay offset variations has been to try to design circuit elements with minimum temperature sensitivity. Unfortunately, this can add significantly to both the cost and complexity of the circuit, and does not fully resolve the problem.

SUMMARY OF THE INVENTION

The present invention seeks to provide a PDC which automatically compensates for environmentally induced variations in its delay, in an accurate and effective manner, without adding substantially to the circuit's cost or complexity.

These goals are achieved with a compensated PDC in which a dummy PDC emulates one or more main PDCs in environmental sensitivity. With dynamically changing inputs to the main PDCs but a substantially constant input to the dummy PDC, changes in the dummy PDC's delay are monitored and a correction signal is applied to the dummy PDC to maintain its delay substantially constant. Correction signals which match the dummy circuit's correction signal are also applied to the main PDCs to hold their delays substantially constant in a similar manner.

The dummy circuit compensation is preferably accomplished with a feedback circuit. The feedback circuit could be designed with a wide adjustment range, allowing it to be set to any value within a full period of a reference clock that is substantially less subject to environmentally induced changes than are the main and dummy PDCs. However, a wide feedback range can result in undesirable jitter, limited signal head room and limited refire rates. To avoid these problems, the dummy delay circuit is initially programmed so that its total delay is an integer number of reference clock periods. This allows for a dummy delay path that produces a delayed output coinciding with the rising edge of a clock pulse. Since environmentally induced variations in the offset delay will normally be significantly less than a full clock period, this initial calibration allows the controllable range of the delay path to be made relatively small, thus largely avoiding the adverse effects of a larger controllable range. The calibration can be implemented through programmable digital-to-analog converters which reside in the main and dummy PDCs.

These and other features and advantages of the invention will be apparent to those skilled in the art from the following detailed description, taken together with the accompanying drawings.

BRIEF DESCRIPTION OF THE DRAWINGS

FIG. 2 is a block diagram of a dummy PDC used to generate correction signals for the main PDCs;

FIG. 3. is a graph illustrating the operation of a ramp comparator employed as a variable delay element in the main and dummy PDCS; and FIG. 4 is a timing diagram illustrating a programmed delay and its correction range for the dummy PDC, in relation to a clock reference.

DETAILED DESCRIPTION OF THE INVENTION

Figure 1:
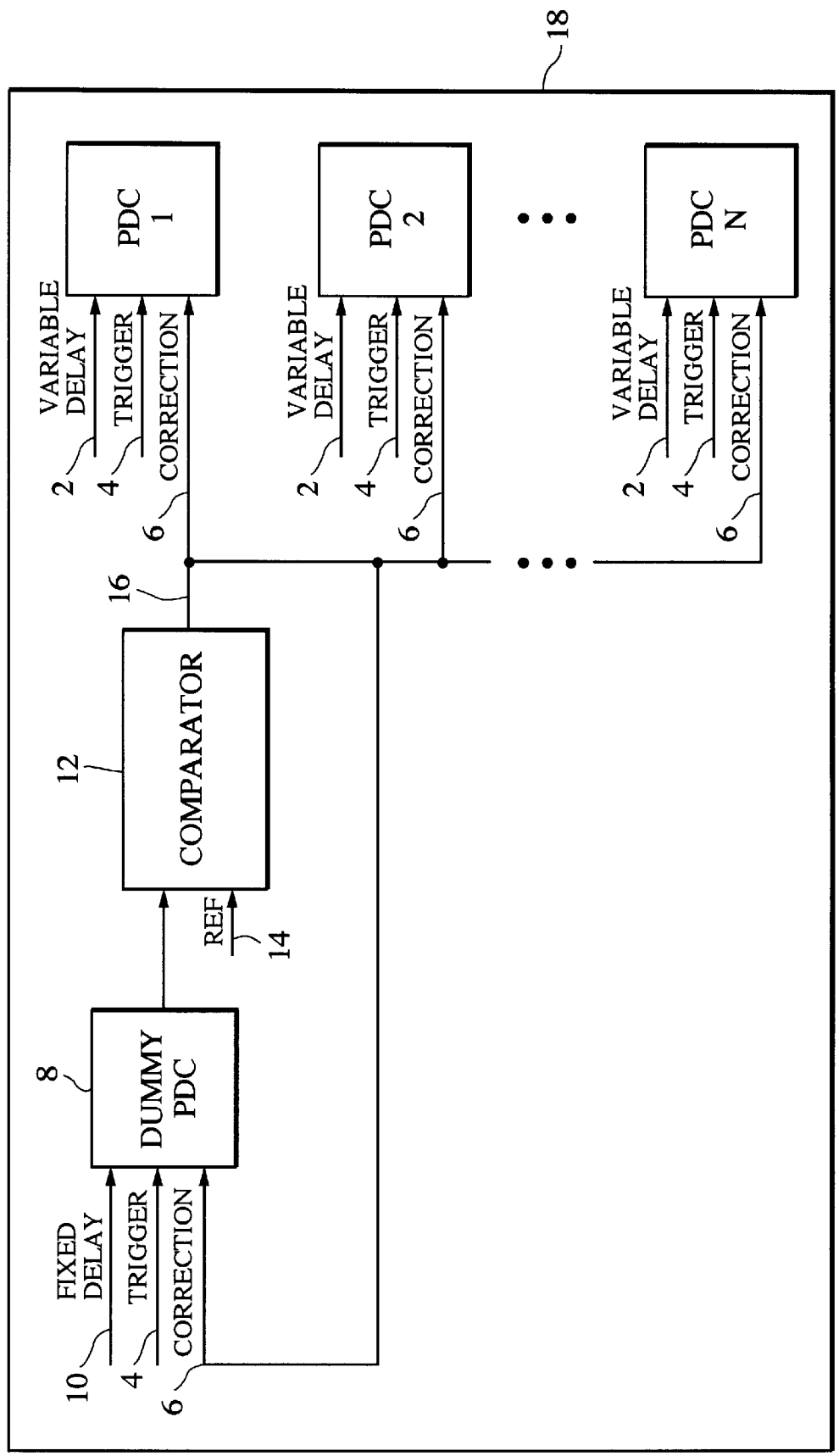
FIG. 1 is a block diagram of a series of PDCS, with compensation for environmental variations, in accordance with the invention.

FIG. 1 illustrates the general principles of the invention by which variations in the actual delay of one or more PDCs, due to variations in environmental factors such as temperature and power supply, are automatically compensated without adding substantially to the cost or complexity of the overall circuit. In the illustration of FIG. 1 a common correction factor is applied to each of several main PDCs, designated as PDC1, PDC2, . . . , PDCN, such as may be used in connection with a timing interpolator. Each of the PDCs includes a variable delay input 2 which in normal operation receives a dynamically varying digital delay control signal that sets the delay period, a trigger input 4 that initiates a delay cycle in response to a digital trigger signal, and a correction input 6 that adjusts the delay period to correct for environmentally induced errors.

The compensation circuit includes a dummy PDC 8 that emulates each of the main PDCs in the sensitivity of its programmed delay to changes in environment. For this purpose the dummy PDC should ideally duplicate all of the components in each of the main PDCs. Even if some of the main PDC elements are not considered to be sensitive to environmental changes, they will still preferably be included in the dummy PDC in case they actually have some small degree of environmental sensitivity, and to make the dummy PDC as close as possible to the main PDCs.

In contrast to the dynamically changing delay control signals that are applied to the main PDCs, a fixed delay control signal is applied to the dummy PDC 8 at its delay control input 10. Although this results in the dummy PDC having a programmed delay that will normally be different from that of the main PDCs, the delay offset error that varies with environmental changes is generally independent of the programmed delay duration. Thus, it is not necessary to emulate the actual programmed delays of the main PDCs to provide a correction for the offset error.

The dummy PDC 8 includes trigger and correction inputs 4 and 6 analogous to the main PDCs. Its output is applied to a comparator 12 which compares the actual delay produced by the dummy PDC with a reference delay at reference input 14 that is insensitive to changes in the environment. The reference delay period is equal to the desired delay for the dummy and main PDCs in the absence of environmental changes. The comparator's output 16 reflects any discrepancies between the desired reference delay period and the actual delay produced by the dummy PDC. This output will be non-zero if the dummy PDC's delay has shifted from its desired duration. The difference is employed as a correction input to the dummy PDC in a negative feedback loop that changes the nominal delay of the dummy PDC to compensate for the detected error and reduce it to zero.

The correction signal produced by monitoring the dummy PDC in this fashion is also applied to each of the main PDCs. Since the dummy and main PDCs are in close enough proximity that they should experience substantially the same environment, and they have the same circuit structure, the offset error experienced by each of the main and dummy PDCs should be substantially the same. Accordingly, applying the same correction signal to each of the main PDCs along with the dummy PDC should also substantially eliminate the offset error for the main PDCs. It is thus possible to compensate for environmental changes to the main PDCs, which have dynamically varying delay control inputs, by maintaining a fixed delay period for a dummy PDC with a constant delay control input.

The main and dummy PDCs are preferably implemented in an integrated circuit on a common circuit chip 18, with the dummy PDC physically located close enough to the main PDCs so that it is exposed to substantially the same temperature as the main PDCs. Since its circuit design is identical (or at least very similar) to that of the main PDCs, the dummy PDC is not expensive to add. It does have a cost in circuit area and power, but these will be relatively small when the dummy PDC is used to compensate a relatively large number of main PDCs, and the cost will generally be justified by the resulting benefit of an extremely low delay sensitivity to temperature and power supply variations. A block diagram of a dummy PDC, along with correction circuitry that keeps the delays of the main and dummy PDCs substantially constant, is shown in FIG. 2. The dummy PDC circuitry is enclosed within dashed line 20; this circuitry emulates and should be as identical as possible to the main PDC circuits. If the main PDCs have additional functions, including multiplexers which allow for the introduction of additional functions, these should also be emulated in the dummy PDC. The circuitry would employ the usual differential digital inputs, but for simplicity one-line inputs are shown.

A clock circuit 22, typically 800 Mhz, is preferably employed as a timing reference for all of the PDCs. Clock circuits are commonly available which generate precise clock periods that are substantially independent of environmental variations over typical operating ranges.

The clock output is applied to a D-type flip-flop circuit 24, which also receives the trigger (data) input 4. A trigger signal is applied to initiate an output pulse after the prescribed delay period set by the PDC. Upon receiving the leading edge of a clock pulse, the D-type flip-flop circuit 24 transfers the present state of its trigger input to its output, which is applied to the SET input of a set/reset flip-flop 26. This circuit produces a high output when its SET input is high, and then reverts to a low output when its RESET input goes high.

The output of set/reset flip-flop 26 is connected as a trigger input to a ramp comparator circuit 28. A threshold input to ramp comparator 28 is provided by a digital-to-analog converter (DAC) 30. The ramp comparator 28 is a conventional circuit that generates an internal ramp signal in response to a trigger input, and produces an output when the ramp signal exceeds the threshold level set by DAC 30. As explained below, it is important that the ramp signal be substantially linear (constant slope) to enable an accurate compensation for the effect of environmental variations.

In addition to being applied to the trigger input of ramp comparator 28, the output of set/reset flip-flop 26 is connected as a reset input to the D-type flip-flop 24 to reset this circuit as soon as a trigger output has been produced by set/reset flip-flop 26; this reduces the settling time of flip-flop 24 and enhances its speed of operation. Similarly, the output of ramp comparator 28 is connected back to the reset input to set/reset flip-flop 26 to enhance this circuit's operating speed, and prepare it for the next delay trigger pulse by resetting it as soon as an output is produced by the ramp comparator.

The ramp comparator output is also connected to a one-shot circuit 32 which transforms the narrow pulse from the ramp comparator 28 into a pulse of controlled duration, typically 1 nsec. Control lines 33 allow for the adjustment of the ramp slope for ramp comparator 28 and the duration of the pulse from one-shot 32. The one-shot output is connected as one input to a phase detector 34, with the other input coming from the clock 22. The phase detector 34 compares the leading edges of the one-shot and clock signals to detect any phase differential between them. As explained in more detail below, it is preferred that the reference delay period established by DAC 30 and ramp comparator 28 be equal to an integer number of clock periods. Given such a setup, any phase differential detected between the leading edges of the one-shot output and the clock signal will indicate an environmentally-induced change in the delay (between the onset of an actuating signal at trigger input 4 and the production of an output pulse from one-shot circuit 32) produced by the dummy PDC. Since such environmentally-induced delay changes normally fall within expected operating ranges that are considerably less than a half clock period, there is no ambiguity as to whether the phase detector 34 is comparing the one-shot output to the correct clock pulse when the dummy PDC's programmed delay is set to a period equal to multiple clock pulses.

Phase detector 34 produces a zero output when its two inputs are in phase with each other, indicating that the dummy PDC (and therefore also the main PDCs) have not strayed from their desired delay settings. If, however, the phase detector does detect a differential between its monitored inputs, it produces an output to a voltage-to-current converter amplifier 36 that increases with the size of the differential. Alternately, a D type flip-flop may be used as a phase detector to determine whether to speed up or slow down the loop. The converter 36 converts the input voltage signal from phase detector 34 to an output current signal. A loop filter capacitor 38 integrates the converter amplifier's output and connects a resulting voltage signal in a feedback loop 40 to the correction input 6 of the dummy DAC 30. In the specific circuit illustrated, the converter amplifier 36 charges the capacitor 38 if the leading edge of the output from one-shot 32 arrives at the phase detector 34 after the leading edge of the clock pulse, and discharges the capacitor if it arrives before the leading edge of the clock pulse.

The signal at the DAC correction input 6 establishes an offset that adds to (or subtracts from) the programmed delay which has previously been established by the application of a substantially constant delay setting to the DAC at its programmed delay input 42. The result is an adjustment of the threshold level for ramp comparator 28 that compensates for environmentally-induced change by either increasing or reducing the delay period. The correction signal is also applied to the correction inputs 6 of the DACs in each of the main PDCs, which assures that their delay errors are compensated in the same manner as the dummy PDC. Thus, even though the dummy PDC employs a fixed programmed delay in contrast to the dynamically variable programmed delays of the main PDCs, it accurately corrects for environmentally induced errors.

FIG. 3 illustrates in simplified form the operation of the invention's delay correction. Upon receipt of a trigger signal indicating the beginning of a delay period, ramp comparator 28 generates a ramp signal 44 that increases linearly with time and establishes the delay period. With a programmed threshold level ThP established by the programmed delay input 42 to DAC 30, corresponding to a programmed delay DP, ramp 44 increases up to the ThP level and then produces an output pulse. This resets set/reset flip-flop 26 to remove the trigger from the ramp comparator and thus terminate the ramp signal.

This operation assumes that no discrepancy has been detected by phase detector 34 between the delayed output pulse from one-shot 32 and the clock reference. However, if such a discrepancy is detected, it indicates a shift in the desired delay period due to environmental variations. In that event the compensation circuit provides a correction signal to the DAC 30 that produces an offset in the DAC output in a direction that compensates for the detected discrepancy. In the example of FIG. 3, the output pulse from one-shot 32 has arrived at the phase detector 34 prior to the corresponding clock pulse, indicating an undesired shortening of the delay period. To compensate for this, the correction signal applied to DAC 30 causes the DAC to raise the threshold level for ramp comparator 28 to a compensated level ThC, which corresponds to a longer compensated delay period DC. The same correction signal is applied to the DACs in all of the main PDCs, producing a correction in the delay period of these elements also.

The capacitor 38 holds the correction signal applied to DAC 30. If the correction is insufficient, a current output continues to be produced by voltage-current converter 36 that further discharges the capacitor (in the case of the delay period being too short) until the correction signal applied to DAC 30 produces a threshold setting for ramp comparator 28 that restores the delay period to a precise coincidence with the clock signal. If, on the other hand, the actual delay is longer than desired, the converter 36 charges the capacitor 38 to produce a correction input for DAC 30 that lowers the threshold for ramp comparator 28 until the desired delay is restored. Capacitor 38 thus integrates the current output of converter 36 to establish a DAC correction signal.

It should be noted that the ramp signal 44 has a substantially constant slope. This causes the compensated delay period to be directly proportional to the linear sum of the program and correction inputs to DAC 30. This linear summing of programmed and correction delay periods allows the invention to operate successfully at any desired programmed delay level.

FIG. 4 illustrates the preferred manner of correlating the fixed, programmed delay signal input 42 to the dummy PDC DAC 30 with the clock signal. Although theoretically the fixed delay could be set to any number of clock periods, either integer or not, with a controllable delay range for the dummy PDC as large as the control range of the main PDCs, this has adverse effects with respect to jitter, headroom and refire rates. In practice, the amount of delay deviation that will ordinarily be encountered due to environmental variations is only a small portion of a typical clock period. This problem can be resolved by setting the fixed delay for the dummy PDC equal to an integer number of clock periods, with the controllable range of the dummy PDC delay substantially less than a full clock period.

As illustrated in FIG. 4, the clock signal 46 consists of a series of uniform pulses. With an appropriate setting of the programmed delay input 42 to dummy DAC 30, the rising edge 48 of the dummy PDC's output fixed delay pulse (corresponding to the output of one-shot 32) coincides with the leading edge 50 of a clock pulse. The corrective action described above locks the fixed delay pulse to the clock pulse's leading edge 50. Since the expected range of environmentally-induced delay errors is narrow, indicated by band 52 having a much narrower width than one clock pulse and centered on the delay pulse leading edge 48, there is no ambiguity as to the particular clock pulse to which the delay pulse is locked.

To lock the fixed delay edge 48 to the leading clock pulse edge 50, an initial calibration is performed under known environmental conditions such as temperature and power supply levels. A signal that is estimated to produce the desired threshold level for ramp comparator 28 is applied to the programmed delay input 42 of dummy DAC 30. The phase detector 34 output is then monitored. A condition in which the fixed delay is locked to the leading edge of a desired clock pulse is indicated by the phase detector's differential outputs toggling back and forth in polarity. If, on the other hand, the phase detector output maintains a constant polarity, indicating the presence of a fixed polarity differential between its two inputs, the programmed delay input to dummy DAC 30 is adjusted until the two phase detector inputs are equal, resulting in an output of toggling polarity. This can conveniently be accomplished by adjusting the programmed delay input signal to identify the opposite edges of the range within which the phase detector output alternates in polarity, and setting the permanent programmed delay input to the middle of this range.

The dummy DAC 30 circuit used for calibration is preferably identical to the DACs used for normal programming of the main PDCs. This assists in making the invention very simple and inexpensive to implement, since the dummy PDC merely replicates what is already in the main PDCs.

While a particular embodiment of the invention has been shown and described, numerous variations and alternate embodiments will occur to those skilled in the art. Accordingly, it is intended that the invention be limited only in terms of the appended claims.

I claim:

1. A compensated programmable delay circuit (PDC), comprising:
   a main PDC whose delay is subject to change with variations in its environment, and
   a compensation circuit which compensates for environmentally induced changes in the main PDC's delay, comprising:
      a dummy PDC which emulates said main PDC in sensitivity to said environment,
      a monitor circuit connected to monitor changes in the dummy PDC's delay, and
      a correction circuit connected to supply matched correction signals to said dummy and main PDCs, in response to monitored changes in the dummy PDC's delay, to maintain their delays substantially constant,
   said main and dummy PDCs comprising respective constant slope ramp comparators, and said monitor and correction circuits connected in a feedback circuit for said dummy PDC to adjust the threshold levels of said ramp comparators.

2. The compensated PDC of claim 1, further comprising a clock circuit that generates a clock signal substantially less subject to changes with variations in its environment than are said main and dummy PDCs, said monitor circuit monitoring changes in the dummy PDC's delay by comparing said delay to said clock signal.

3. The compensated PDC of claim 2, wherein said dummy circuit is initially programmable to establish a reference delay for said monitor circuit substantially equal to a fixed number of periods of said clock signal.

4. The compensated PDC of claim 3, wherein said fixed number of periods is an integer.

5. A compensated programmable delay circuit (PDC), comprising:
- a main PDC whose delay is subject to change with variations in its environment, and
- a compensation circuit which compensates for environmentally induced changes in the main PDC's delay, comprising:
  - a dummy PDC which emulates said main PDC in sensitivity to said environment,
  - a monitor circuit connected to monitor changes in the dummy PDC's delay, and
  - a correction circuit connected to supply matched correction signals to said dummy and main PDCs, in response to monitored changes in the dummy PDC's delay, to maintain their delays substantially constant,
- wherein said main and dummy PDCs include respective delay control circuits which produce a PDC delay equal to the linear sum of a programmed delay and a correction delay resulting from said correction signal.

6. The compensated PDC of claim 5, wherein said delay control circuits comprise respective constant slope ramp comparators, and said correction circuit adjusts the threshold levels of said ramp comparators.

7. A compensated programmable delay circuit (PDC), comprising:
- a main PDC whose delay is subject to change with variations in its environment, and
- a compensation circuit which compensates for environmentally induced changes in the main PDC's delay, comprising:
  - a dummy PDC which emulates said main PDC in sensitivity to said environment,
  - a monitor circuit connected to monitor changes in the dummy PDC's delay, and
  - a correction circuit connected to supply matched correction signals to said dummy and main PDCs, in response to monitored changes in the dummy PDC's delay, to maintain their delays substantially constant,
- wherein said main and dummy PDCs include respective programmable digital-to-analog converters (PDACs) which establish their respective delays, and said correction circuit applies said matched correction signals to said PDACs.

8. The compensated PDC of claim 7, wherein said monitor and correction circuits are connected in a feedback circuit for said dummy circuit PDAC.

9. A compensated programmable delay circuit (PDC), comprising:
- a main PDC whose delay is subject to change with variations in its environment,
- a compensation circuit which compensates for environmentally induced changes in the main PDC's delay, comprising:
  - a dummy PDC which emulates said main PDC in sensitivity to said environment,
  - a monitor circuit connected to monitor changes in the dummy PDC's delay, and
  - a correction circuit connected to supply matched correction signals to said dummy and main PDCS, in response to monitored changes in the dummy PDC's delay, to maintain their delays substantially constant, and
- additional main PDCs whose delays are subject to change with variations in their environment, said correction circuit connected to supply correction signals to said additional main PDCs which match the correction signal supplied to said dummy PDC.

10. The compensated PDC of claim 1, wherein said main PDC and compensation circuit are implemented on a common circuit chip.

11. The compensated PDC of claim 1, wherein said main PDC's delay is subject to change with variations in its temperature and power supply.

12. A compensated programmable delay circuit (PDC), comprising:
- a first main PDC whose delay is subject to change with variations in its environment, and
- a compensation circuit which compensates for environmentally induced changes in the first main PDC's delay, comprising:
  - a dummy PDC which emulates said first main PDC in sensitivity to said environment and is programmable to an accurately measurable delay,
  - a feedback circuit for said dummy PDC which adjusts said dummy PDC to maintain its delay substantially constant in response to variations in its environment, and
  - a correction circuit for said first main PDC which applies an adjustment to said first main PDC that matches said dummy PDC adjustment, to maintain the first main PDC's delay substantially constant,
- said first main PDC and dummy PDC comprising respective constant slope ramp comparators, and said feedback circuit adjusting the threshold levels of said ramp comparators.

13. The compensated PDC of claim 12, further comprising a clock circuit that generates a clock signal substantially less subject to variations in its environment than are said first main and dummy PDCs, said clock signal providing a reference for said feedback circuit.

14. The compensated PDC of claim 13, wherein said reference is equal to a substantially fixed number of periods of said clock signal.

15. The compensated PDC of claim 14, wherein said fixed number of periods is an integer.

16. A compensated programmable delay circuit (PDC), comprising:
- a first main PDC whose delay is subject to change with variations in its environment, and
- a compensation circuit which compensates for environmentally induced changes in the first main PDC's delay, comprising:
  - a dummy PDC which emulates said first main PDC in sensitivity to said environment and is programmable to an accurately measurable delay,
  - a feedback circuit for said dummy PDC which adjusts said dummy PDC to maintain its delay substantially constant in response to variations in its environment, and
  - a correction circuit for said first main PDC which applies an adjustment to said first main PDC that matches said dummy PDC adjustment, to maintain the first main PDC's delay substantially constant, said main and dummy PDCs including respective delay control circuits which produce a PDC delay equal to the linear sum of a programmed delay and a correction delay resulting from said correction signal.

17. The compensated PDC of claim 16, wherein said delay control circuits comprise respective constant slope ramp comparators, and said correction circuit adjusts the threshold levels of said ramp comparators.

18. A compensated programmable delay circuit (PDC), comprising:
   a first main PDC whose delay is subject to change with variations in its environment,
   a compensation circuit which compensates for environmentally induced changes in the first main PDC's delay, comprising:
      a dummy PDC which emulates said first main PDC in sensitivity to said environment and is programmable to an accurately measurable delay,
      a feedback circuit for said dummy PDC which adjusts said dummy PDC to maintain its delay substantially constant in response to variations in its environment, and
      a correction circuit for said first main PDC which applies an adjustment to said first main PDC that matches said dummy PDC adjustment, to maintain the first main PDC's delay substantially constant, and
   additional main PDCs which are compensated by said compensation circuit in a manner similar to said first main PDC.

19. A compensated programmable delay circuit (PDC) comprising:
   a main PDC whose delay is subject to change with variations in its environment,
   a compensation circuit which compensates for environmentally induced changes in the main PDC's delay, comprising:
      a dummy PDC which emulates said main PDC in sensitivity to said environment,
      a clock circuit that generates a clock signal substantially less subject to changes with variations in its environment than are said main and dummy PDCs,
      a phase detector connected to detect changes in phase between said clock signal and the output of said dummy PDC, and in response to produce an error signal, and
      an integrator connected to integrate said error signal, and
      a correction circuit connected to apply the integrated error signal to adjust the programming of said main and dummy PDCs to maintain their delays substantially constant,
      said main and dummy PDCs comprising constant slope ramp comparators, and said phase detector and integrator connected in a feedback circuit for said dummy PDC to adjust the threshold levels of said ramp comparators.

20. A compensated programmable delay circuit (PDC), comprising:
   a main PDC whose delay is subject to change with variations in its environment,
   a compensation circuit which compensates for environmentally induced changes in the main PDC's delay, comprising:
      a dummy PDC which emulates said main PDC in sensitivity to said environment,
      a clock circuit that generates a clock signal substantially less subject to changes with variations in its environment than are said main and dummy PDCs,
      a phase detector connected to detect changes in phase between said clock signal and the output of said dummy PDC, and in response to produce an error signal, and
      an integrator connected to integrate said error signal, and
      a correction circuit connected to apply the integrated error signal to adjust the programming of said main and dummy PDCs to maintain their delays substantially constant,
      said main and dummy PDCs including respective programmable digital-to-analog converters PDACs which establish their respective delays, and said integrator being connected to apply said integrated error signal to adjust the programming of said PDCs.

21. The compensated PDC of claim 20, wherein said integrator comprises a capacitor that generates said integrated error signal as a voltage signal, and said correction circuit includes a voltage-to-current converter connected to convert a voltage signal to a current signal for charging or discharging said capacitor.

22. The compensated PDC of claim 20, wherein said dummy PDC's PDAC is initially programmable to establish a reference delay equal to a substantially fixed number of clock periods.

23. The compensated PDC of claim 22, wherein said fixed number of clock periods is an integer.

24. A method of compensating a main programmable delay circuit (PDC) for changes in its delay that would otherwise result from variations in its environment, comprising:
   establishing a reference delay that is substantially independent of variations in said environment,
   detecting changes in said main PDC delay relative to said reference delay with a dummy PDC that emulates the response of said main PDC to variations in said environment and generates a constant slope delay ramp in establishing a dummy delay, and
   adjusting the programming of said main PDC in response to said detected changes so as to maintain its delay substantially constant by having said main PDC generate a constant slope delay ramp and adjusting threshold levels for said main and dummy PDC delay ramps in response to said detected changes.

25. The method of claim 24, wherein changes in said main PDC delay are detected by providing a dummy PDC that emulates the response of said main PDC to variations in said environment, and detecting changes in the dummy PDC delay relative to said reference delay.

26. The method of claim 25, wherein the programming of both said main and said dummy PDCs are adjusted in response to detected changes in the dummy PDC delay so as to maintain the delays of both said main and dummy PDCs substantially constant.

27. The method of claim 26, wherein said reference delay is established as a function of a clock signal that is substantially insensitive to said environmental variations.

28. The method of claim 27, wherein said reference delay is established as a substantially fixed number of periods of said clock signal.

29. The method of claim 28, wherein said fixed number of periods is an integer.

30. The method of claim 26, wherein the programming of said dummy PDC is adjusted by feeding back to said dummy PDC a correction signal representing detected changes in the dummy PDC delay, and the programming of said main PDC is adjusted by applying a mirror of said correction signal to said main PDC.

31. A method of compensating a main programmable delay circuit (PDC) for changes in its delay that would otherwise result from variations in its environment, comprising:

establishing a reference delay that is substantially independent of variations in said environment, detecting changes in said main PDC delay relative to said reference delay, adjusting the programming of said main PDC in response to said detected changes so as to maintain its delay substantially constant, detecting changes in said main PDC delay by providing a dummy PDC that emulates the response of said main PDC to variations in said environment, and detecting changes in the dummy PDC delay relative to said reference delay, and adjusting the programming of additional main PDCs based upon detected changes in the dummy PDC delay relative to said reference delay.

32. A method of operating a main programmable delay circuit (PDC) with a substantially constant delay despite variations in its environment, comprising:

providing a dummy PDC that emulates the response of said main PDC to variations in said environment, applying dynamically changing input signals to said main PDC, applying a substantially constant input signal to said dummy PDC, detecting changes in the dummy PDC delay, and adjusting both said main and said dummy PDCs in response to detected changes in the dummy PDC delay so as to maintain the delays of both said main and dummy PDCs substantially constant, wherein said main and dummy PDCs generate respective constant slope delay ramps in establishing their respective delays, and said main and dummy PDCs are adjusted by adjusting threshold levels of their delay ramps.

33. The method of claim 32, wherein said changes in the dummy PDC delay are detected by comparing the dummy PDC delay to a reference delay that is substantially insensitive to said environmental variations.

34. The method of claim 33, wherein said reference delays is provided as a clock signal.

35. The method of claim 34, wherein said reference delay is established as a substantially fixed number of periods of said clock signal.

36. the method of claim 35, wherein said fixed number of periods is an integer.

* * * * *